United States Patent
Bedeschi et al.

(10) Patent No.: US 7,483,296 B2
(45) Date of Patent: Jan. 27, 2009

(54) MEMORY DEVICE WITH UNIPOLAR AND BIPOLAR SELECTORS

(76) Inventors: Ferdinando Bedeschi, Via Ambrosini, 6, I-20052 Monza (MI) (IT); Fabio Pellizzer, Via Peroz, 16, I-31051 Follina (TV) (IT); Augusto Benvenuti, Via San Bernardino, 42, I-24040 Lallio (BG) (IT); Loris Vendrame, Via Grande di Carbonera, 73, I-31030 Carbonera (TV) (IT); Paola Zuliani, Via Berna, 11/4, I-20146 Milano (MI) (IT)

( * ) Notice: Subject to any disclaimer, the term of this patent is extended or adjusted under 35 U.S.C. 154(b) by 3 days.

(21) Appl. No.: 11/233,464

(22) Filed: Sep. 22, 2005

(65) Prior Publication Data

US 2006/0062051 A1    Mar. 23, 2006

(30) Foreign Application Priority Data

Sep. 22, 2004   (EP) .................................. 04104595

(51) Int. Cl.
   *G11C 11/36* (2006.01)
(52) U.S. Cl. .................. 365/175; 365/177; 365/163
(58) Field of Classification Search ................ 365/177, 365/175, 163, 185.21, 185.05, 52, 63; 257/205, 257/197, 368–370, 378, E31.069, E27.015
   See application file for complete search history.

(56) References Cited

U.S. PATENT DOCUMENTS

| | | | |
|---|---|---|---|
| 3,827,034 A | 7/1974 | Colaco | |
| 4,791,611 A | 12/1988 | Eldin et al. | |
| 5,166,758 A | 11/1992 | Ovshinsky et al. | |
| 5,978,258 A | 11/1999 | Manning | |
| 6,118,691 A | 9/2000 | Kalnitsky et al. | |
| 6,381,168 B2 * | 4/2002 | Forbes | 365/149 |
| 6,442,065 B1 * | 8/2002 | Hofmann et al. | 365/175 |
| 6,462,984 B1 * | 10/2002 | Xu et al. | 365/175 |
| 6,813,177 B2 * | 11/2004 | Lowrey et al. | 365/148 |
| 6,862,216 B1 * | 3/2005 | Hopper et al. | 365/185.05 |
| 6,977,425 B2 * | 12/2005 | Yoshida et al. | 257/517 |
| 7,085,153 B2 * | 8/2006 | Ferrant et al. | 365/149 |
| 2002/0079524 A1 | 6/2002 | Dennison | |
| 2003/0086291 A1 | 5/2003 | Lowry | |

OTHER PUBLICATIONS

European Search Report, EP 04104595, Apr. 1, 2005.
Esseni, David, et al., A New High Injection Efficiency Non-Volatile Memory Cell: BipFlash, Solid State Electronics, vol. 46, No. 11, Nov. 2002.

* cited by examiner

*Primary Examiner*—David Lam
(74) *Attorney, Agent, or Firm*—Lanny L. Parker (57) ABSTRACT

A memory device is proposed. The memory device includes a plurality of memory cells, wherein each memory cell includes a storage element and a selector for selecting the corresponding storage element during a reading operation or a programming operation. The selector includes a unipolar element and a bipolar element. The memory device further includes control means for prevalently enabling the unipolar element during the reading operation or the bipolar element during the programming operation.

24 Claims, 5 Drawing Sheets

MEMORY DEVICE WITH UNIPOLAR AND BIPOLAR SELECTORS

PRIORITY CLAIM

This application claims priority from European patent application No. EP04104595.6, filed Sep. 22, 2004, which is incorporated herein by reference.

TECHNICAL FIELD

The present invention relates to the data storage field. More specifically, the present invention relates to a memory device; moreover, the invention also relates to a corresponding method of operating a memory device.

BACKGROUND

Different types of memory devices have been proposed in the last years. For example, a phase-change $E^2PROM$ is a non-volatile memory exploiting the properties of a material that can be reversibly switched between an amorphous phase and a crystalline phase. The phase-change material exhibits different electrical characteristics depending on its phase, each one representing a corresponding logic value. An example of a phase-change $E^2PROM$ is described in U.S. Pat. No. 5,166,758.

Typically, the memory device includes a matrix of memory cells, each one consisting of a storage element connected in series to an access selector. During a reading or programming operation on the memory device, the selectors are suitable biased so as to allow accessing the corresponding storage elements.

A solution known in the art for implementing those selectors is that of using bipolar elements; for example, each bipolar element can be a diode (as described in US-A-2002/0079524) or a base/emitter junction of a BJT transistor. In this case, the bipolar element is forward biased when selected (while it is reverse biased otherwise).

A drawback of the solution described above is that the bipolar element exhibits a high leakage current when reverse biased. Moreover, the bipolar element involves a high voltage drop when forward biased (for example, 0.6 V); this voltage drop adversely affects the accuracy of the reading operation.

In order to avoid the drawbacks referred to above, the selectors are commonly implemented with MOS transistors (and especially NMOS transistors). However, in this case each NMOS transistor must be quite wide in order to sustain the high current that necessarily flows through the corresponding storage element during a programming operation. This causes a waste of area in a chip of semiconductor material wherein the memory device is typically integrated.

SUMMARY

According to an aspect of the present invention, a selector with both a bipolar element and a unipolar element (that are exploited alternatively) is suggested.

Particularly, an aspect of the invention provides a memory device that includes a plurality of memory cells. Each memory cell includes a storage element and a selector for selecting the corresponding storage element during a reading operation or a programming operation. The selector includes a unipolar element and a bipolar element. The memory device further includes control means for prevalently enabling the unipolar element during the reading operation or the bipolar element during the writing operation.

In this way, during the reading operation it is avoided the voltage drop that adversely affects the accuracy of the reading operation.

At the same time, the programming operation can be executed without requiring a wide selector.

In other words, the proposed solution combines the advantages of both the unipolar element and the bipolar element, but without suffering the respective drawbacks.

The preferred embodiments of the invention described in the following provide additional advantages.

For example, according to a preferred embodiment of the invention, the unipolar element includes a field effect transistor and the bipolar element is intrinsic.

This structure avoids using any additional mask for the manufacturing process of the memory device.

A way to further improve the solution is to connect the selectors of the same row to a corresponding switching line. In this way, the components required for controlling the selectors are reduced to the minimum.

According to an embodiment of the invention, each selector has the field effect transistor which is connected between the storage element and a reference terminal.

This implementation is very simple (with the bipolar element that consists of a diode).

In another embodiment of the invention, the field effect transistor is connected between the storage element and a well region (which is short-circuited to a region of the field effect transistor).

The proposed structure is really effective (with the bipolar element consisting of a transistor that drains the writing current towards a substrate of the chip).

A preferred embodiment of the invention involves combining the well regions of the selectors belonging to the same row into a common region.

Preferably, the common regions are separated from each other by insulation elements.

This structure ensures the optimal operation of the memory device.

According to an embodiment of the invention, the insulation elements are deeper than the well regions.

This implementation is very compact.

In a different embodiment, the insulation elements are less deep than the well regions.

Conversely, in this case the manufacturing process is simplified.

Another aspect of the present invention provides a corresponding method of operating a memory device.

BRIEF DESCRIPTION OF THE DRAWINGS

Further features and advantages of the solution according to the present invention will be made clear by the following description of a preferred embodiment thereof, given purely by way of a non-restrictive indication, with reference to the attached figures, in which:

FIG. 2b illustrates the equivalent circuit of the selector of FIG. 2a;

FIG. 3b illustrates the equivalent circuit of the selector of FIG. 3a;

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
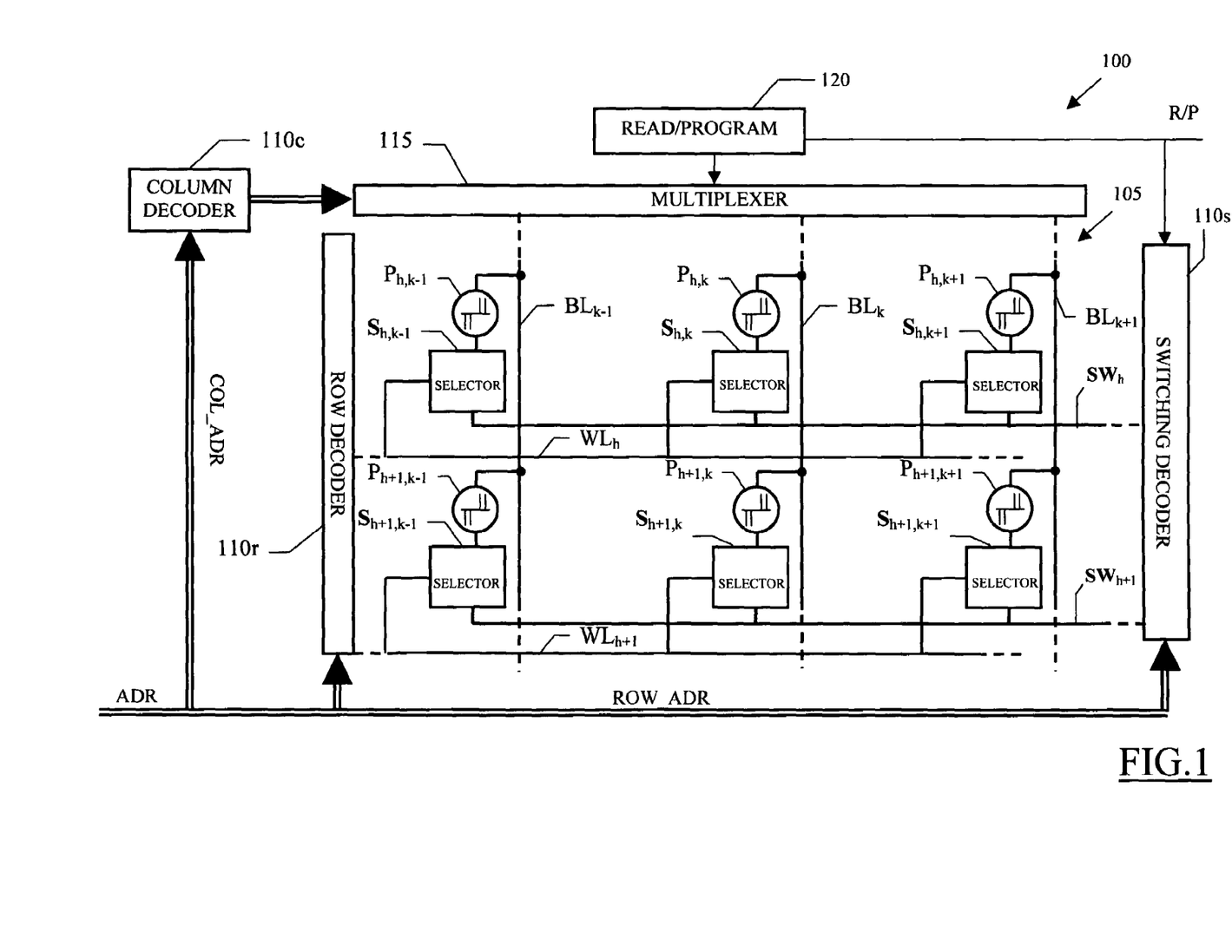
FIG. 1 shows a schematic block diagram of a memory device according to an embodiment of the present invention.

With reference in particular to FIG. 1, a memory device 100, consisting of an $E^2PROM$ of the phase-change type, is shown. The memory device 100 includes a matrix 105 of memory cells (for example, arranged in n=512 rows and m=1024 columns). Each memory cell is formed by a storage element $P_{h,k}$ (with h=1 . . . n and k=1 . . . m) having a programmable resistivity; the storage element $P_{h,k}$ is connected in series to an access selector $S_{h,k}$.

Each storage element $P_{h,k}$ is made of a phase-change material; typically, the phase-change material consists of a calcogenide (such as an alloy $Ge_2Sb_2Te_5$). The phase-change material can be reversibly switched between a generally amorphous, disordered phase and a generally crystalline, high ordered phase. The two phases of the material exhibit different electrical characteristics; particularly, the material in the amorphous phase has a high resistivity (defining a reset state associated with a first logic value, for example, 0), whereas the material in the crystalline phase has a low resistivity (defining a set state associated with a second logic value, for example, 1).

Without descending to particulars well known in the art, the phase of the material is stable below a predefined temperature (such as 150° C.). The phase can be changed by heating the material over that temperature. For this purpose, a voltage higher than a corresponding phase-change value Vpc (for example, 0.6V) is applied to the storage element $P_{h,k}$; this voltage causes a current to flow through a resistive element (or heater) in contact with the phase-change material, which element heats by the Joule effect and then raises the temperature of the change-phase material accordingly. If the storage element $P_{h,k}$ is brought over a nucleation temperature (such as 200° C.) and kept there for enough time, the change-phase material becomes crystalline; conversely, if the storage element $P_{h,k}$ is brought over a higher melting temperature (such as 600° C.) and then cooled rapidly, the change-phase material becomes amorphous. The state of the storage element $P_{h,k}$ is detected by applying a reading voltage (lower than the phase-change value Vpc, so as not to affect the phase of the material). The resulting current flowing through the storage element $P_{h,k}$ is a signature of the resistivity of the material and then of its phase.

The memory device 100 further includes a bit line $BL_k$ for each column of the matrix 105, and a pair word line $WL_h$/switching line $SW_h$ for each row thereof. More specifically, the storage elements $P_{h,k}$ of each column have a first terminal connected to the corresponding bit line $BL_k$. A second terminal of each storage element $P_{h,k}$ is connected to a terminal of the respective selector $S_{h,k}$. The selectors $S_{h,k}$ of each row have other two terminals that are connected to the corresponding word line $WL_h$ and switching line $SW_h$, respectively.

The memory device 100 simultaneously processes a word (for example, consisting of 16 bits). The bits of each word are stored in memory cells $P_{h,k}$-$S_{h,k}$ of a single row; the bit lines $BL_k$ of the matrix 105 are grouped into 16 sub-sets, each one for a bit of the different words.

Each word is identified by an address ADR. A portion of the address ADR (COL_ADR) is provided to a column decoder 110c. The column decoder 110c drives a multiplexer 115, which selects a bit line $BL_k$ of the word in each sub-set. The multiplexer 115 interfaces with a read/program unit 120; the read/program unit 120 includes all the components (such as sense amplifiers, comparators, charge pumps, reference cells, pulse generators, and the like), which are used to program the selected storage elements $P_{h,k}$ or to read their values. The read/program unit 120 receives a control signal R/P indicative of the desired operation (read or program). Another portion of the address ADR (ROW_ADR) is provided to a row decoder 110r and to a switching decoder 110s (which also receives the control signal R/P). The row decoder 110r selects the word line $WL_h$ of the desired word. The switching decoder 110s controls the selectors $S_{h,k}$ according to the operation to be performed (as described in detail in the following).

Considering now FIG. 2a, the structure of a generic selector S according to a first embodiment of the invention is illustrated in a cross-sectional view (in the following, the indexes h,k will be omitted for the sake of simplicity). As usual, the concentrations of n-type and p-type impurities (or dopant) are denoted by adding the sign + or the sign − to the letters n and p to indicate a high or low concentration of impurities, respectively; the letters n and p without the addition of any sign + or − denote concentrations of intermediate value.

Particularly, the memory device is integrated in a chip of semiconductor material 200, having a substrate 205 of the p-type. The selector S consists of a PMOS transistor M, which is formed in a well region 210 of the n-type extending into the substrate 205 from an upper surface of the chip 200. A drain region 215 and a source region 220, both of the p+ type, extend into the well region 210 (from the upper surface of the chip 200). A contact region 225 having a high concentration of impurity (n+) likewise extends into the well region 210; preferably the contact region 225 is directly adjacent to the source region 220, but it could be displaced if the reverse junction leakage is unbearable during programming. An insulated control gate 230 bridges between the drain region 215 and the source region 220.

The structure described above also defines an intrinsic diode D, which is formed by the p-n junction between the source region 220 (anode) and the contact region 225 (cathode).

The drain region 215 is connected to a terminal providing a reference voltage (or ground). The source region 220 is connected to the first terminal of the corresponding storage element P, which second terminal is connected to the respective bit line BL. The control gate 230, on the other hand, is connected to the respective word line WL.

In order to explain operation of the above-described structure, reference will be made to its equivalent circuit illustrated in FIG. 2b.

During a reading operation, a selected word line WL is driven to a low voltage (for example, $V_L$=−2V), while the other word lines are driven to a relatively high voltage (for example, $V_{hr}$=400 mV). At the same time, all the switching lines SW are driven to the voltage $V_{hr}$. The selected bit lines BL (of the desired word) are connected to the read/program unit and are driven to the voltage $V_{hr}$, while the other bit lines are left floating.

In this way, each selector S identified by the intersection of the selected lines is enabled. More specifically, the PMOS transistor M turns on; conversely, the diode D is reverse biased. Therefore, the PMOS transistor M operates in a normal way, and drains a reading current flowing through the corresponding storage element P toward the ground terminal. Therefore, the diode D does not interfere with operation of the selector S.

During a programming operation, the selected word line WL is driven to the voltage $V_L$, while the other word lines are driven to a high voltage $V_{hp} > V_{hr}$ (for example, $V_{hp}$=700 mV); the switching line SW corresponding to the selected word line is driven to ground, while the other switching lines are driven to the voltage $V_{hp}$. At the same time, the selected bit lines BL are connected to the read/program unit and are driven to the voltage $V_{hp}$, while the other bit lines are left floating.

Even in this case, each selector S identified by the intersection of the selected lines is enabled. However, the diode D is now forward biased; therefore, a programming current flowing through the storage element P is drained towards the ground terminal primarily or prevalently by the diode D (with at most a small portion thereof that flows through the PMOS transistor M). So, even with high programming currents it is possible to have a small size of the PMOS transistor M (and then of the whole selector S), since it must not be dimensioned to sustain those currents.

Figure 2A:
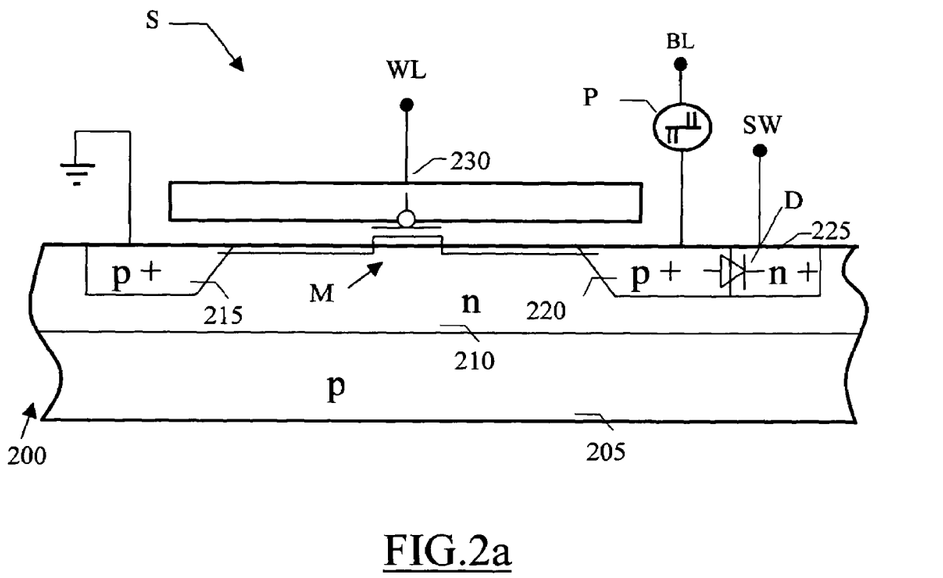
FIG. 2a illustrates the structure of a selector of the memory device of FIG. 1.
Figure 2B:
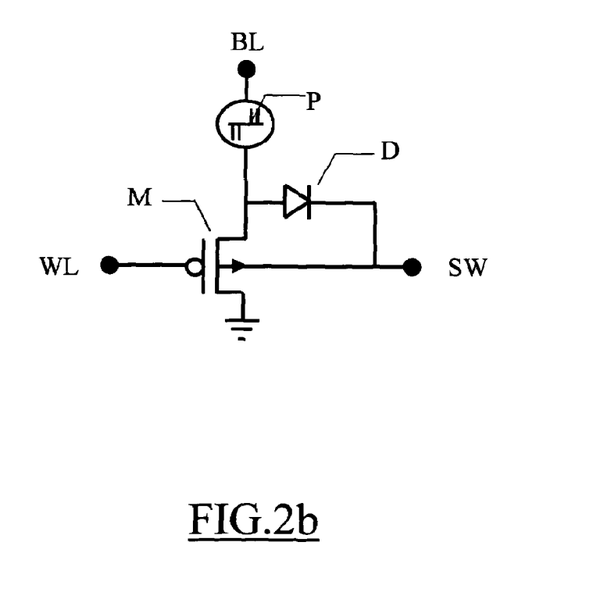
Figure 3A:
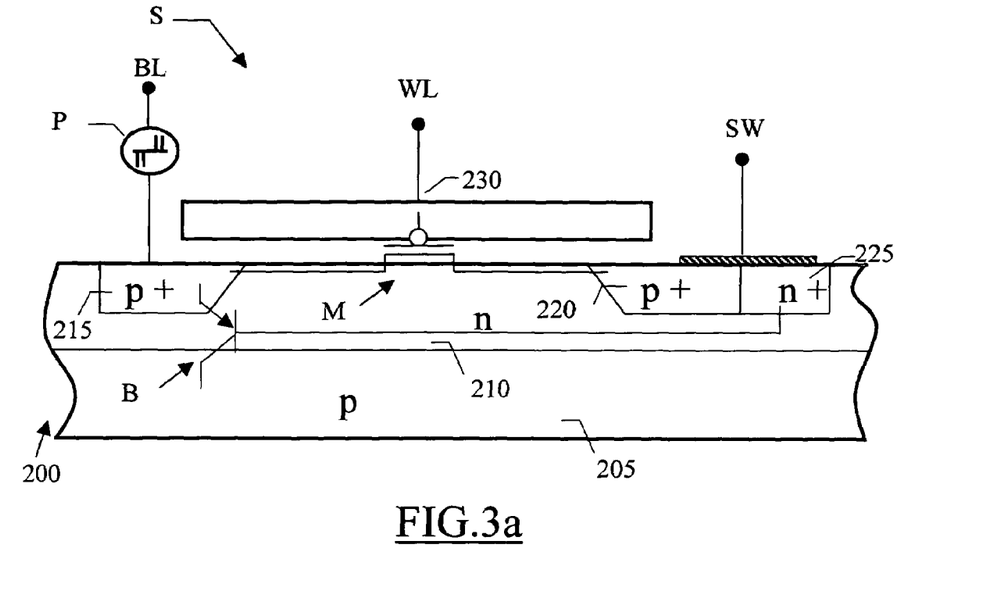
FIG. 3a illustrates a different structure of the selector of FIG. 1.

Considering now FIG. 3a, the structure of a generic selector according to a second embodiment of the invention is illustrated in a cross-sectional view (the elements corresponding to the ones shown in the FIG. 2a are denoted with the same references, and their explanation is omitted for the sake of brevity). According to this embodiment, the regions 215 and 220 can operate either as drain region or source region (as will be explained in the following). The region 215 is connected to the first terminal of the corresponding storage element P (which second terminal is connected to the respective bit line BL); the region 220 and the contact region 225 are short-circuited to the switching line SW.

The structure described above also defines an intrinsic vertical bipolar transistor B (of the PNP type), which is formed by the region 215 (emitter), the well region 210 (base) and the substrate 205 (collector).

Figure 3B:
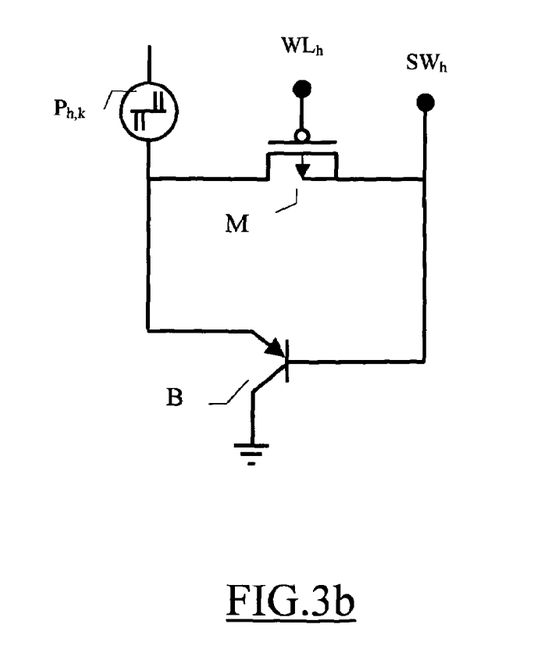

In order to explain operation of the above-described structure, reference will be made to its equivalent circuit illustrated in FIG. 3b.

During a reading operation, a selected word line WL is driven to a low voltage (for example, $V_{Lr}$=0), while the other word lines are driven to a high voltage (for example, a power supply voltage of the memory device $V_{dd}$=3.3V). All the switching lines SW are driven to the voltage $V_{dd}$. At the same time, the selected bit lines BL are connected to the read/program unit and are driven to the voltage $V_{Lr}$, while the other bit lines are left floating.

In this way, each selector S identified by the intersection of the selected lines is enabled. More specifically, the PMOS transistor M turns on, while the bipolar transistor B remains off. Therefore, the PMOS transistor M operates in a normal way, and drains the reading current toward the ground terminal (with the bipolar transistor B that does not interfere with operation of the selector S).

During a programming operation, the selected word line WL is driven to the voltage $V_{Lr}$, while the other word lines are driven to the voltage $V_{hp}$; the switching line SW corresponding to the selected word line is driven to ground, while the other switching lines are driven to the voltage $V_{hp}$. At the same time, the selected bit lines BL are connected to the read/program unit and are driven to the voltage $V_{hp}$, while the other bit lines are left floating.

Even in this case, each selector S identified by the intersection of the selected lines is enabled. However, the bipolar transistor B now turns on, and primarily or prevalently drains the programming current towards the ground terminal.

Figure 4:
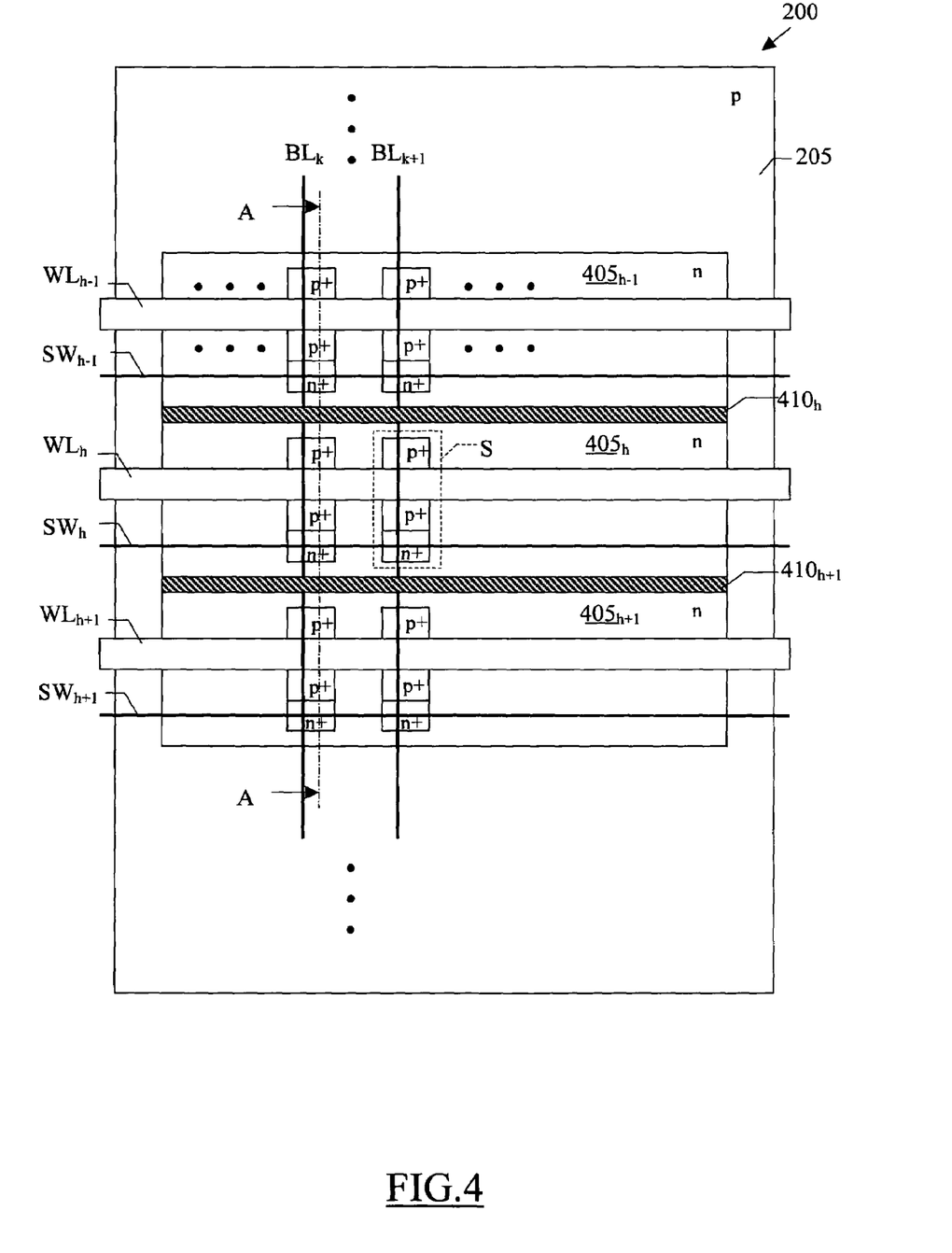
FIG. 4 illustrates a simplified top view of the memory device of FIG. 1.

Referring now to FIG. 4, a top view of a simplified architectural structure of the chip 200 is illustrated. In the figure all the contacts are omitted, so that the proposed solution applies to both the embodiments described above.

As can be seen, the selectors S corresponding to each word line $WL_h$ are made in a common n-well region denoted with $405_h$ (which is driven by the corresponding switching line $SW_h$).

For a correct working of the programming operation, during which the activated selectors S must be driven in such a way to exploit the corresponding bipolar element (diode D or bipolar transistor B), it is necessary that the n-well regions $405_h$ should be insulated per word line $WL_h$.

In fact, the bipolar elements are obtained by means of junctions placed in the n-well regions $405_h$; if two selectors S belonging to the same bit line $BL_k$ (but to different world lines $WL_h$ and $WL_{h+1}$) were placed in the same n-well region, the bipolar elements of the two selectors S would interfere one with the other.

For this purpose, an insulating region consisting of a Shallow Trench Isolated (STI) zone $410_h$ is interposed between each pair of adjacent n-well regions $405_h$ and $405_{h+1}$. In this way, each n-well region $405_h$ is driven only by the corresponding switching line $SW_h$, and is not influenced by the adjacent n-well regions $405_{h-1}$ and $405_{h+1}$.

Figure 5A:
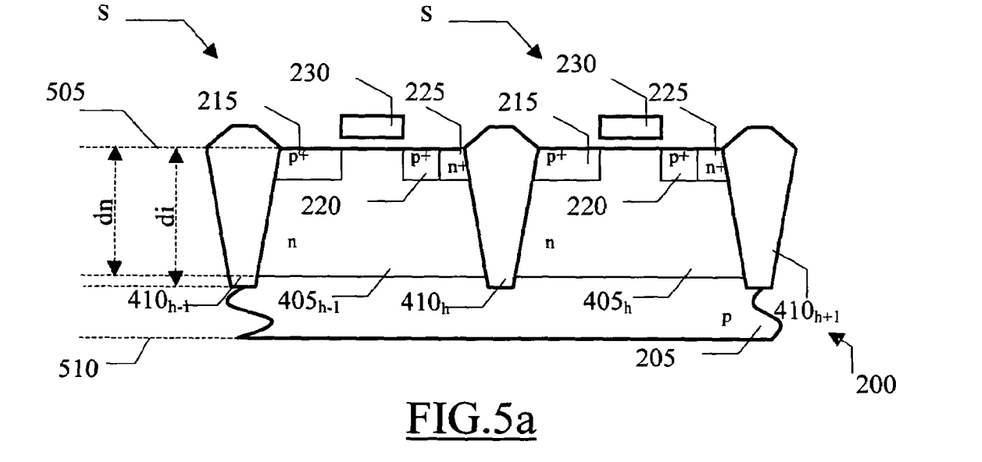
FIGS. 5a and 5b show a cross-sectional view of the memory device of FIG. 1 according to two different architectural embodiments.

Considering now FIG. 5a, the structure of a generic pair of adjacent selectors S (along the direction of the bit lines BL) according to a first embodiment of the invention is illustrated in a cross-sectional view along the line AA of FIG. 4. In this case, each insulating region $410_h$ extends into the chip 200 from an upper surface 505 with a depth $d_i$ which is equal or greater than the depth $d_n$ of the n-well regions $405_h$.

As a result, it is possible to create a single n-well region, and then divide it into the different common regions $405_h$ by means of the insulating regions $410_h$. This solution is very compact; however it needs a dedicated process for the insulating regions $410_h$ (that are deeper than the ones of the circuitry that is used to control operation of the memory device), or a dedicated implant process to create the n-well regions $405_h$ (that are shallower than the ones used in the circuitry).

Figure 5B:
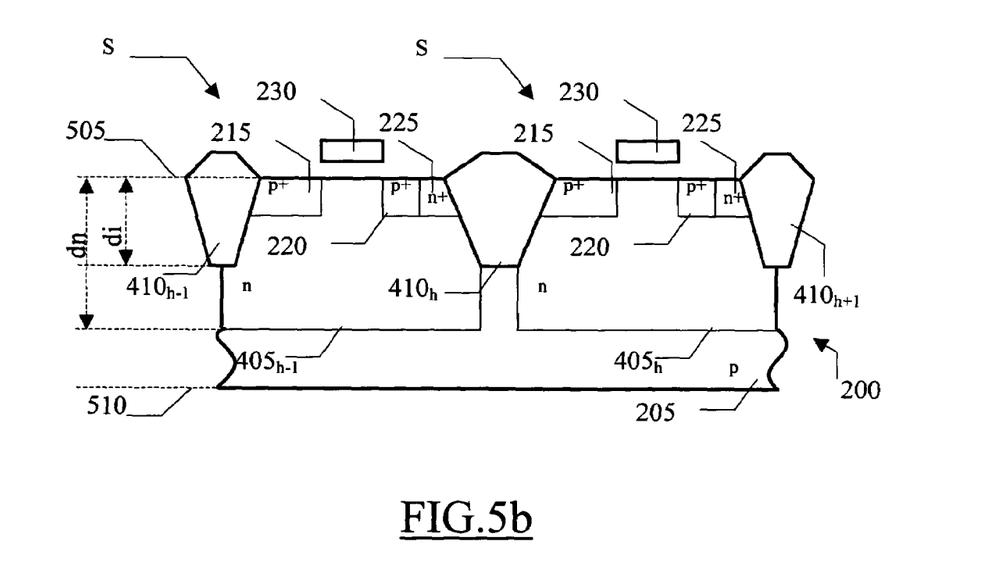

An alternative solution is illustrated in FIG. 5b (the elements corresponding to the ones shown in the FIG. 5a are denoted with the same references, and their explanation is omitted for the sake of brevity). In this case, the depth $d_i$ of the insulating regions $410_h$ is lower than the depth $d_n$ of the n-well regions $405_h$.

Therefore, the n-well regions $405_h$ must be realized individually. Therefore, this solution does not require any new or dedicated processes. However, it takes up more area because a minimum distance must be maintained between adjacent n-well regions $405_h$ for the design rules.

Although the present invention has been described above with a certain degree of particularity with reference to preferred embodiment(s) thereof, it should be understood that various changes in the form and details as well as other embodiments are possible. Particularly, it is expressly intended that all combinations of those elements and/or method steps that substantially perform the same function in the same way to achieve the same results are within the scope of the invention.

For example, similar considerations apply if the memory device has a different structure or includes equivalent elements. Moreover, even though in the preceding description reference has been made to a phase-change E²PROM, this is not to be intended as a limitation; in fact, the concepts of the present invention are also applicable to different memory devices having similar characteristics.

The same considerations apply if the switching decoder and the row decoder are combined into a single component, or if other means are used to control the selectors.

The reference to a PMOS transistor as unipolar element is merely illustrative; in fact, even a more generic field effect transistor can be used.

The concepts of the present invention are also applicable when every p-doped region is exchanged with an n-doped one, and vice versa. Moreover, the word lines and/or the bit lines can be replaced with equivalent biasing lines and read/program lines, respectively.

In addition, the use of insulation elements different from the STI zones is contemplated.

Moreover, it will be apparent to those skilled in the art that the additional features providing further advantages are not essential for carrying out the invention, and may be omitted or replaced with different features.

For example, the bipolar element can be a separated device, and not an intrinsic element (even if this implementation may be less advantageous).

The solution of the present invention is also suitable to be implemented with a dedicated n-well region for each selector.

Moreover, it is possible to use a different structure for controlling the selectors (even with dedicated signals).

Alternatively, the n-well regions can be insulated in another way (even without any interposed STI zone).

Moreover, the use of other process steps for making the STI zones is contemplated.

Naturally, in order to satisfy local and specific requirements, a person skilled in the art may apply to the solution described above many modifications and alterations all of which, however, are included within the scope of protection of the invention as defined by the following claims.

The memory device 100 including embodiments of the present invention may be included in a variety of different types of electronic systems, such as computer systems, cellular telephones, personal digital assistants, and any other type of system requiring non-volatile storage.

The invention claimed is:

1. A memory device including a plurality of memory cells, wherein each memory cell includes a storage element and a selector for selecting the corresponding storage element during a reading operation or a programming operation, the selector including a unipolar element, wherein
   the selector further includes a bipolar element, the memory device further including control means for prevalently enabling the unipolar element and disabling the bipolar element during the reading operation and the control means enabling the bipolar element and disabling the unipolar element during the programming operation.

2. A memory device including a plurality of memory cells, wherein each memory cell includes a storage element and a selector for selecting the corresponding storage element during a reading operation or a programming operation, the selector including a unipolar element, wherein
   the selector further includes a bipolar element, the memory device further including control means for prevalently enabling the unipolar element during the reading operation or the bipolar element during the programming operation;
   wherein each unipolar element includes a field effect transistor having a first region and a second region of a first type of conductivity being formed in a well region of a second type of conductivity opposite the first type, and an insulated control gate between the first region and the second region, and wherein the corresponding bipolar element includes a junction between a selected one of the first and second regions and the well region, the control means forward biasing the junction during the programming operation and reverse biasing the junction during the reading operation.

3. A memory device including a plurality of memory cells, wherein each memory cell includes a storage element and a selector for selecting the corresponding storage element during a reading operation or a programming operation, the selector including a unipolar element, wherein
   the selector further includes a bipolar element, the memory device further including control means for prevalently enabling the unipolar element during the reading operation or the bipolar element during the programming operation;
   wherein each unipolar element includes a field effect transistor having a first region and a second region of a first type of conductivity being formed in a well region of a second type of conductivity opposite the first type, and an insulated control gate between the first region and the second region, and wherein the corresponding bipolar element includes a junction between a selected one of the first and second regions and the well region, the control means forward biasing the junction during the programming operation and reverse biasing the junction during the reading operation; and
   wherein the memory cells are arranged in a matrix having a plurality of rows and a plurality of columns, the storage elements of each column having a first terminal connected to a corresponding read/program line and a second terminal connected to the selected region of the corresponding field effect transistor, and wherein the field effect transistors of each row have the control gate connected to a corresponding biasing line and the well region connected to a corresponding switching line, the switching line being driven by the control means.

4. The memory device according to claim 3, wherein each field effect transistor has the first region connected to a reference terminal providing a reference voltage and the second region connected to the second terminal of the corresponding storage element.

5. The memory device according to claim 3, wherein each field effect transistor has the first region connected to the second terminal of the corresponding storage element and the second region short-circuited to the well region.

6. The memory device according to claim 3, wherein the well regions of the field effect transistors of each row consist of a single common region, the memory device further including means for insulating each pair of adjacent common regions.

7. The memory device according to claim 6, wherein the memory device is integrated in a chip of the first type of conductivity having a first and a second main surfaces opposite to each other, each common region extending into the chip from the first surface with a first depth, and wherein the means for insulating includes an insulation element between each pair of adjacent common regions, the insulation element extending into the chip from the first surface with a second depth ($d_i$).

8. The memory device according to claim 7, wherein the second depth is at least equal to the first depth.

9. The memory device according to claim 7, wherein the second depth is lower than the first depth.

10. A method of operating a memory device including a plurality of memory cells, the method including the steps of:
selecting a storage element of at least one of the memory cells during a reading operation or a programming operation through a corresponding selector, wherein
the step of selecting includes prevalently enabling a unipolar element and disabling a bipolar element of the selector during the reading operation and disabling the unipolar element and enabling the bipolar element of the selector during the programming operation.

11. A memory device including a plurality of memory cells, each memory cell including a storage element and a selection circuit, the selection circuit including a unipolar element and a bipolar element and the selection circuit being operable during a read mode to access the memory cell through the unipolar element and operable during a programming mode to access the memory cell through the bipolar element, wherein each unipolar element includes a field effect transistor having a first region and a second region of a first type of conductivity being formed in a well region of a second type of conductivity opposite the first type, and an insulated control gate between the first region and the second region, and wherein the corresponding bipolar element includes a junction between a selected one of the first and second regions and the well region, the junction of the bipolar element being forward biased during the programming mode and being reverse biased during the read mode.

12. The memory device of claim 11 wherein accessing the memory cell during the first or second modes comprises sinking or sourcing a current from or to the memory cell to detect a programming state of the memory corresponding to a logic state of date stored in the memory cell.

13. The memory device of claim 11 wherein each memory cell comprises a phase-change memory cell.

14. The memory device of claim 11 wherein each selection circuit comprises:
a field effect transistor corresponding to the unipolar element, the transistor having a first region and a second region of a first conductivity type and being formed in a well region having a second conductivity type that is opposite the first conductivity type, and the transistor including a control gate structure formed overlying the first and second regions.

15. The memory device of claim 14 wherein the bipolar element comprises a diode.

16. The memory device of claim 15 wherein the diode is formed by the second region of the unipolar element and a third region having the second conductivity type.

17. The memory device of claim 14 wherein the bipolar element comprises a bipolar transistor.

18. The memory device of claim 17 wherein the bipolar transistor includes the first region of the unipolar element, the well region, and a substrate having the first conductivity type in which the well region is formed.

19. An electronic system, comprising:
an electronic subsystem including a memory device including a plurality of memory cells, each memory cell including a storage element and a selection circuit, the selection circuit including a unipolar element and a bipolar element and the selection circuit being operable during a first mode to access the memory cell through the unipolar element and operable during a second mode to access the memory cell through the bipolar element; and wherein each unipolar element includes a field effect transistor having a first region and a second region of a first type of conductivity being formed in a well region of a second type of conductivity opposite the first type, and an insulated control gate between the first region and the second region, and wherein the corresponding bipolar element includes a junction between a selected one of the first and second regions and the well region, the junction of the bipolar element being forward biased during the programming operation and being reverse biased during the reading operation.

20. The electronic system of claim 19 wherein the subsystem comprises a cellular telephone.

21. The electronic system of claim 20 wherein each storage element comprises a phase-change element.

22. A method of sensing data stored in and programming data into a memory cell, the method comprising:
passing a first current through the memory cell and through an activated unipolar element;
sensing a logic state of data stored in the memory cell responsive to the first current;
passing a second current through the memory cell and through a junction of an activated bipolar element;
programming data having a desired logic state into the memory cell responsive to the second current; and
reverse biasing the junction of the bipolar element during the operations of passing a first sensing current and sensing a logic state.

23. The method of claim 22 wherein during the operation of passing current through the memory cell and through the bipolar element a first current flows through the bipolar element and a second current flows through the unipolar element, the first current being much greater than the second current.

24. The method of claim 22 wherein a majority carrier through the unipolar element is holes.

* * * * *